(12) United States Patent
Spann

(10) Patent No.: US 10,347,549 B2
(45) Date of Patent: *Jul. 9, 2019

(54) POWER SEMICONDUCTOR DEVICE MODULE HAVING MECHANICAL CORNER PRESS-FIT ANCHORS

(71) Applicant: IXYS, LLC, Milpitas, CA (US)

(72) Inventor: Thomas Spann, Fuerth (DE)

(73) Assignee: LITTELFUSE, INC., Chicago, IL (US)

( * ) Notice: Subject to any disclaimer, the term of this patent is extended or adjusted under 35 U.S.C. 154(b) by 101 days.

This patent is subject to a terminal disclaimer.

(21) Appl. No.: 15/376,662

(22) Filed: Dec. 13, 2016

(65) Prior Publication Data

US 2017/0316993 A1 Nov. 2, 2017

Related U.S. Application Data

(63) Continuation-in-part of application No. 15/143,575, filed on Apr. 30, 2016, now Pat. No. 10,062,621.

(51) Int. Cl.
| | |
|---|---|
| *H01L 23/52* | (2006.01) |
| *H01L 23/049* | (2006.01) |
| *H01L 23/10* | (2006.01) |
| *H01R 12/58* | (2011.01) |
| *H01L 23/40* | (2006.01) |

(Continued)

(52) U.S. Cl.
CPC ............ *H01L 23/049* (2013.01); *H01L 23/10* (2013.01); *H01R 12/585* (2013.01); *H01L 23/4006* (2013.01); *H01L 25/072* (2013.01); *H01R 12/52* (2013.01)

(58) Field of Classification Search
CPC ..... H01L 23/4006; H01L 23/16; H01L 23/02; H01L 23/049

USPC .......................... 257/678, 686, 690, 691, 692
See application file for complete search history.

(56) References Cited

U.S. PATENT DOCUMENTS

| | | | |
|---|---|---|---|
| 8,030,749 B2 * | 10/2011 | Soyano | H01L 25/072 257/688 |
| 8,598,697 B2 | 12/2013 | Kirsch et al. | 257/693 |
| 9,437,460 B2 * | 9/2016 | Yoshimatsu | H01L 21/4853 |

(Continued)

OTHER PUBLICATIONS

"Mounting Instructions for PressFIT Modules with Forked Pins: EconoPack/EconoPIM/EconoBRIDGE", Infineon Application Note AN2007-09-V2.0, 16 pages (Nov. 2012).

(Continued)

*Primary Examiner* — Sheila V. Clark

(57) ABSTRACT

A power semiconductor device module includes a metal baseplate and a plastic housing that together form a tray. Power electronics are disposed in the tray. A plastic cap covers the tray. Electrical press-fit terminals are disposed along the periphery of the tray. Each electrical terminal has a press-fit pin portion that sticks up through a hole in the cap. In addition, the module includes four mechanical corner press-fit anchors disposed outside the tray. One end of each anchor is embedded into the housing. The other end is an upwardly extending press-fit pin portion. The module is manufactured and sold with the press-fit pin portions of the electrical terminals and the mechanical corner anchors unattached to any printed circuit board (PCB). The mechanical anchors help to secure the module to a printed circuit board. Due to the anchors, screws or bolts are not needed to hold the module to the PCB.

20 Claims, 4 Drawing Sheets

(51) Int. Cl.
*H01L 25/07* (2006.01)
*H01R 12/52* (2011.01)

(56) References Cited

U.S. PATENT DOCUMENTS

| | | | |
|---|---|---|---|
| 2009/0197439 A1 | 8/2009 | Nabilek et al. | 439/82 |
| 2013/0105961 A1* | 5/2013 | Jones | H01L 23/049 |
| | | | 257/691 |
| 2014/0151868 A1* | 6/2014 | Bayerer | H01L 23/02 |
| | | | 257/690 |
| 2014/0199861 A1 | 7/2014 | Mattiuzzo | 439/81 |
| 2014/0246768 A1* | 9/2014 | Soyano | H02M 7/003 |
| | | | 257/691 |
| 2017/0084986 A1* | 3/2017 | Gang | H01Q 1/243 |

OTHER PUBLICATIONS

"Mounting Instructions PressFIT-Pin Module Series E2 and E3", IXYS publication, 4 pages (Nov. 2015).

* cited by examiner

MECHANICAL CORNER PRESS-FIT ANCHOR

EYE-OF-THE-NEEDLE
ELECTRICAL
PRESS-FIT TERMINAL

FORK
ELECTRICAL
PRESS-FIT TERMINAL

POST
ELECTRICAL
PRESS-FIT TERMINAL

POWER SEMICONDUCTOR DEVICE MODULE HAVING MECHANICAL CORNER PRESS-FIT ANCHORS

CROSS REFERENCE TO RELATED APPLICATION

This application is a continuation-in-part of, and claims priority under 35 U.S.C. § 120 from, nonprovisional U.S. patent application Ser. No. 15/143,575 entitled "Power Semiconductor Device Module Having Mechanical Corner Press-Fit Anchors," filed on Apr. 30, 2016. The entire subject matter of application Ser. No. 15/143,575 is incorporated herein by reference.

TECHNICAL FIELD

The described embodiments relate to power semiconductor device modules.

BACKGROUND INFORMATION

FIG. 7 (Prior Art) is a perspective diagram of a common type of conventional power semiconductor device module 100. The four holes 101-104 are used to screw or bolt or otherwise attach the module 100 to a heatsink (not shown) so that the planar bottom side of the module is in good thermal contact with a planar surface of the heatsink. There are press-fit pins that are shown extending upward from the top of the module 100. One of these press-fit pins is labeled 105 in the illustration. These press-fit pins are pressed into corresponding holes in a printed circuit board (not shown). The printed circuit board (PCB) is typically a PCB that has other circuitry and other circuit components mounted on it. That other circuitry and the other circuit components together form a larger power circuit and device of some sort that includes the module 100. After the module 100 has been press-fit to the PCB as is done in the prior art, screws or bolts may be optionally screwed down through holes in the PCB and into corresponding mounting holes 106-109 in the housing frame 110 of the module. These screws or bolts provide additional mechanical strength to the connection between the module and the PCB. Module 100 is a common and commercially successful type of power semiconductor device module.

SUMMARY

A power semiconductor device module includes a metal baseplate and a plastic housing that together form a shallow tray. The plastic housing may be glued to or otherwise engage the metal baseplate so that the shallow tray is formed. Power electronic circuitry is disposed in the tray under a layer of encapsulant, such as silicone gel. A plastic cap covers the tray so as to enclose the power electronics and the silicone layer within a shallow housing. A plurality of electrical press-fit terminals is disposed along the periphery of the tray. Each electrical press-fit terminal has a lower portion and an upper portion. The lower portion in one example includes a laterally-extending landing pad. The lower portion slides into, and is held in place by, a channel on an inner sidewall of the tray. The electronics in the tray is then coupled, for example by a wire bond, to this landing pad portion. The upper portion of each electrical press-fit terminal is a press-fit pin portion. The press-fit pin portion of each electrical press-fit terminal sticks up through a corresponding hole in the cap and extends away from the top of the cap in a direction that is perpendicular to the plane of the bottom surface of the metal baseplate. In addition, the power semiconductor device module includes four novel mechanical corner press-fit anchors. When the power semiconductor device module is considered from the top-down perspective, these four mechanical corner press-fit anchors are disposed outside the confines of the rectangular tray area. There is one such mechanical corner press-fit anchor located adjacent each corner of the power semiconductor device module when the module is considered from the top-down perspective. Each of the four mechanical corner press-fit anchors has one end that is secured into the housing of the module, and has another end that is an upwardly extending press-fit pin portion.

The power semiconductor device module is manufactured and sold in this way, with the press-fit pin portions of the electrical terminals and with the press-fit pin portions of the mechanical corner anchors in place as part of the module, but with all the press-fit pin portions being unattached to any PCB. During press-fit mounting of the module, when the press-fit pin portions at the top of the module are forced into corresponding holes in a PCB, the mechanical anchors help mechanically secure the module to the PCB. Due to the mechanical corner press-fit anchors, screws or bolts that are sometimes otherwise provided in order to hold the module to the PCB are not needed and are not provided. In one example, a mechanical corner press-fit anchor has a barb or a catch. This barb or catch helps secure the anchor into the plastic of the housing. Due to the barb or catch, a substantial pull force can be put on the anchor without the anchor moving back upward and out of the hole. The mechanical corner press-fit anchors, when they are press-fit attached to a PCB, allow the module to resist and withstand substantial pull out forces without moving away from the PCB. The use of the mechanical corner press-fit anchors allows mechanical stresses and warpage problems associated with hold-down screws or bolts to be avoided. Costs and delays and complexities involved in installing the hold-down screws or bolts are also avoided.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to a background example and to some embodiments of the invention, examples of which are illustrated in the accompanying drawings. In the description and claims below, when a first object is referred to as being disposed "over" or "on" or "onto" a second object, it is to be understood that the first object can be directly on the second object, or an intervening object may be present between the first and second objects. Similarly, terms such as "upper", "top", "up", "down", "vertically", "horizontally", "laterally", "lower", "under", "below", "beneath" and "bottom" are used herein to describe relative orientations between different parts of the structure being described, and it is to be understood that the overall structure being described can actually be oriented in any way in three-dimensional space.

Figure 1:
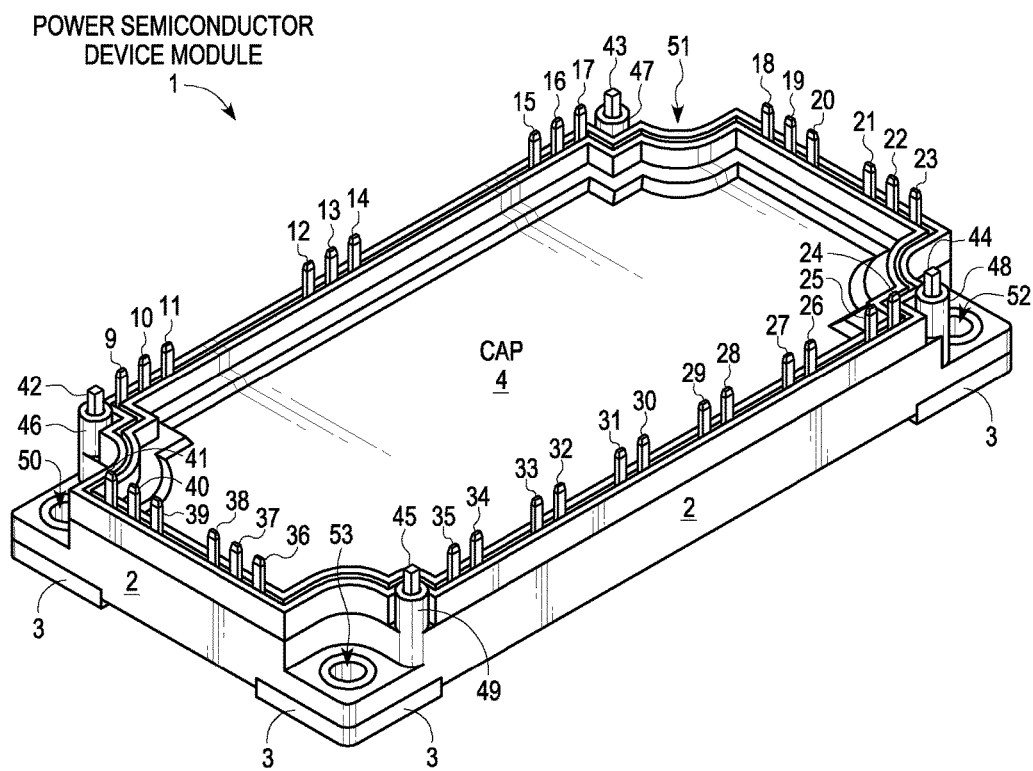
FIG. 1 is a top-down perspective diagram of a power semiconductor device module in accordance with one novel aspect.
Figure 2:
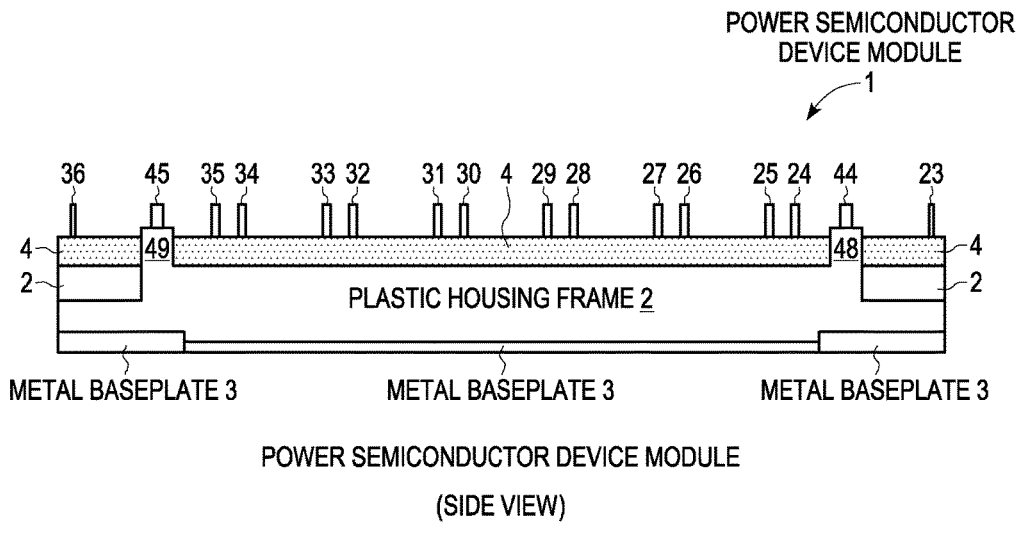
FIG. 2 is a side view of the power semiconductor device module of FIG. 1.
Figure 3:
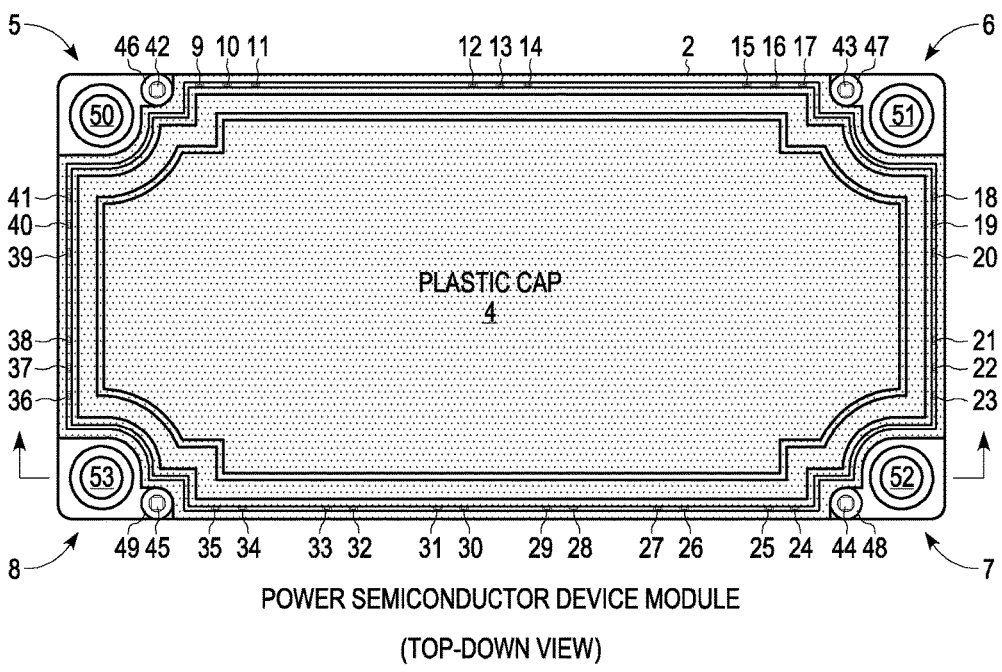
FIG. 3 is a top-down view of the power semiconductor device module of FIG. 1.

FIG. 1 is a top-down perspective diagram of a power semiconductor device module 1 in accordance with one novel aspect. FIG. 2 is a side view of the power semiconductor device module 1 of FIG. 1. FIG. 3 is a top-down view of the power semiconductor device module 1 of FIG. 1.

The power semiconductor device module 1, when considered from the top-down perspective, has a bottom surface and a top surface. The power semiconductor device module 1 includes an injection molded plastic housing frame 2 that along with a metal baseplate 3 forms a central shallow tray-shaped recess or depression. The plastic housing frame 2 extends around and frames the metal baseplate 3. The metal baseplate 3 forms the bottom of the tray. The plastic housing frame 2 forms the sidewalls of the tray. The shallow tray portion of the plastic housing frame 2 has an upper rim.

The metal baseplate 3 has a planar bottom surface that is a part of the bottom surface of the overall power semiconductor device module 1. The planar bottom surface may be perfectly planar or may be very slightly convex-curved. The term "convex" here in the side view perspective of the diagram of FIG. 2 means that the center portion of the bottom surface of the baseplate 3 bows down a bit as compared to the bottom surface of the baseplate 3 at left and right sides of the baseplate. The amount of convex bow is determined by the amount of force with which the module is to be held against a planar heatsink surface, and may depend on various factors including the number and size of hold down bolts, the type and size and shape of the heatsink, and the surface area of the bottom surface of the module that is to contact the heatsink. The bottom surface of the metal baseplate 3 is referred to as being "planar" and is said to be "in a plane", and it is planar and is in a plane in a general sense, but it is to be understood that when considered in fine detail its center may actually have the above-described very slight convex downward bow shape. The phraseology of a "planar bottom surface" that is "in a plane" is understood to describe both the perfectly planar example as well as the example that has the very slightly convex downward bow shape.

Solder-joined to the top surface of the metal baseplate 3 in the bottom of the tray is a semiconductor device assembly (not shown). The semiconductor device assembly, in the present example, includes circuitry involving at least one of the following components: a power diode, a power field effect transistor (MOSFET), a power insulated gate bipolar transistor (IGBT), a power thyristor. Covering this circuitry and assembly is a layer of an encapsulant (not shown), such as a layer of soft silicone gel material.

The power semiconductor device module 1 includes a plastic cap 4. The plastic cap 4 is an injection molded plastic material piece. This cap 4 fits down onto the upper rim of the tray, thereby covering the encapsulant and the open face of the tray. But for an arcuate indent at each of its four corners 5, 6, 7 and 8, the cap 4 when considered from the top-down perspective of FIG. 3 has a rectangular shape. The cap 4 has a row of peripheral holes. These holes form a peripheral ring of holes that extends along the four peripheral side edges of the cap.

The power semiconductor device module 1 includes a plurality of electrical press-fit terminals or pins 9-41. Each of these electrical press-fit terminals has a vertically extending press-fit pin portion and a wider lower base portion. The wider lower base portion includes a laterally extending wiring pad portion. The wiring pad portion is sometimes called a "foot". Each of these electrical press-fit terminals is a stamped, formed and bent piece of sheet metal. An insertion machine press fits the terminal down into an accommodating vertically-extending insertion channel in the plastic of the plastic housing frame 2. The insertion is done so that the channel holds the press-fit terminal in place with respect to the housing frame. After the electrical press-fit terminals are inserted into selected ones of the accommodating channels in plastic housing frame 2, the cap 4 is placed down over the electrical press-fit terminals so that the vertically extending press-fit pin portions of the various electrical press-fit terminals extend up through corresponding ones of the peripheral holes in the cap. When the cap is in place, the press-fit pin portions of the electrical press-fit terminals extend upward and away from the cap in a direction perpendicular to the plane of the planar bottom surface of the metal baseplate. There are fewer electrical press-fit terminals than there are channel positions in the housing frame, and there are fewer electrical press-fit terminals than there are peripheral holes in the cap. Accordingly, some of the channel positions and holes are not filled with electrical press-fit terminals. There is no press-fit terminal extending through some of the holes in the cap.

In one novel aspect, the power semiconductor device module 1 includes four mechanical corner press-fit anchors 42-45. These four mechanical corner press-fit anchors 42-45 are disposed outside the rim of the tray when the overall power semiconductor device module 1 is considered from the top-down perspective. None of the four mechanical corner press-fit anchors 42-45 is electrically connected to any circuitry disposed in the tray. Each of the four mechanical corner press-fit anchors 42-45 has a lower barbed portion and an upper press-fit pin portion. The lower barbed portion secures the anchor to a cylindrical stand-off extension of the housing frame 2 from which the anchor protrudes. The press-fit pin portion of the anchor extends upward and away from the housing frame 2 in a direction perpendicular to the plane of the planar bottom surface of the metal baseplate. Mechanical corner press-fit anchor 42 is disposed adjacent the corner 5 of the power semiconductor device module 1. Mechanical corner press-fit anchor 42 is secured into, and extends upwardly from, a cylindrical stand-off extension 46 of the plastic housing frame 2. Mechanical corner press-fit anchor 43 is disposed adjacent the corner 6 of the power semiconductor device module 1. Mechanical corner press-fit anchor 43 is secured into, and extends upwardly from, a cylindrical stand-off extension 47 of the plastic housing frame 2. Mechanical corner press-fit anchor 44 is disposed adjacent the corner 7 of the power semiconductor device module 1. Mechanical corner press-fit anchor 44 is secured into, and extends upwardly from, a cylindrical stand-off extension 48 of the plastic housing frame 2. Mechanical corner press-fit anchor 45 is disposed adjacent the corner 8 of the power semiconductor device module 1. Mechanical corner press-fit anchor 45 is secured into, and extends upwardly from, a cylindrical stand-off extension 49 of the plastic housing frame 2. As can be seen from the top-down view of FIG. 3, each of the mechanical corner press-fit anchors has a larger cross-sectional area (taken at the surface of the housing) as compared to the smaller cross-sectional area of the electrical press-fit terminals (taken at the surface of the cap).

Although the cylindrical stand-off extensions 46-49 in the specific example illustrated are complete cylindrical structures, the cylindrical stand-off extensions in other examples are somewhat merged with the tray sidewall portion of the remainder of the housing frame. Rather than being cylindrical, the extensions can have an angular shape when considered from the top-down perspective so long as enough plastic material of the housing is provided to allow for the secure and strong attachment of the mechanical corner press-fit anchors to the housing frame.

The power semiconductor device module 1 is sold in this state with the press-fit pin portions of the electrical terminals and the corner anchors extending upward from the top of the module, and without any of these press-fit pin portions being press-fit connected to any PCB.

A PCB has a set of plated through holes. There is one such hole for each of the press-fit pin portions of the module 1. The plated through holes are arranged in the same pattern as are the upwardly extending press-fit pin portions of the module 1. As is known in the art, the plated through hole of the PCB is slightly smaller than the press-fit pin portion that is to go into the hole. Therefore, when the press-fit pin portion is forced into the hole, the press-fit pin portion and the metal of the plated through hole are forced together and form a cold weld. The holes for the press-fit pin portions of the corner anchors 42-45 are larger than the holes for the press-fit pin portions of the electrical press-fit terminals. A special press tool is used to press the module 1 into the PCB. In the illustrated embodiment, no screw or bolt is screwed into the housing frame 2 in order to hold the module 1 to the PCB.

After the module has been press-fit attached to a PCB in this way, then the bottom surface of the power semiconductor device module 1 can be attached to a heatsink (not shown) using mounting holes 50-53. In one example, screws or bolts (not shown) are made to extend through the holes 50-53. As the screws or bolts are tightened, the metal baseplate 3 of the module 1 is pulled against the heatsink so that the bottom of the baseplate is in good thermal contact with the heatsink. There is one mounting hole located at each corner of the housing. The mounting holes 50-53 are unthreaded.

Figure 4:
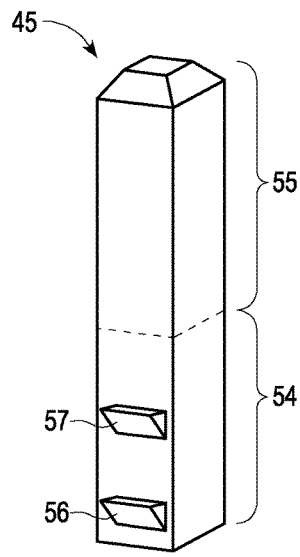
FIG. 4 is a diagram of one example of a mechanical corner press-fit anchor.

FIG. 4 is a diagram of one example of mechanical corner press-fit anchor 45. The anchor 45 is inserted into an axial hole in the cylindrical stand-off extension 49 of the housing frame 2 so that the lower portion 54 of the anchor 45 sticks down into an axial hole in cylindrical stand-off extension 49 and so that the upper press-fit pin portion 55 sticks out of the housing frame 2 as shown in FIG. 1. Stand-off extension 49 is cylindrical in this example, but in other examples the stand-off extension can be of other shapes. Barbs or catches 56 and 57 dig into the resilient plastic polymer material of the inside walls the hole. Due to the barbs 56 and 57, a substantial pull out force can be put on the anchor without the anchor moving with respect to the housing frame. This pull out force is referred to here as the "anchor pull out resist force". Under this force, the anchor remains at the same location in its hole in the housing frame. An individual electrical press-fit terminal has a rated minimum pull out extraction force at which the electrical press-fit terminal is specified to be extractable from a PCB to which the electrical press-fit terminal has been press-fit attached. In one example, the anchor pull out resist force of one of the anchors 42-45 is a force that exceeds the rated minimum pull out extraction force with which an electrical press-fit terminal is specified to be extractable from a PCB.

Figure 5A:
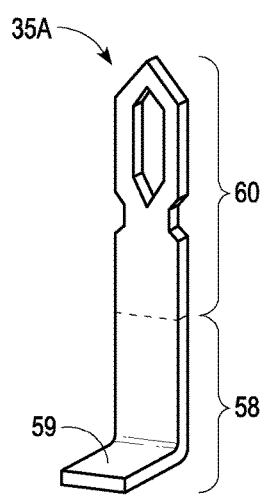
FIG. 5A is a diagram of a first example of an electrical press-fit terminal.

FIG. 5A is a diagram of a first example 35A of electrical press-fit terminal 35. The lower portion 58 of the terminal has a laterally extending landing pad portion 59. The upper press-fit pin portion 60 of this terminal is of the "eye-of-the-needle" type.

Figure 5B:
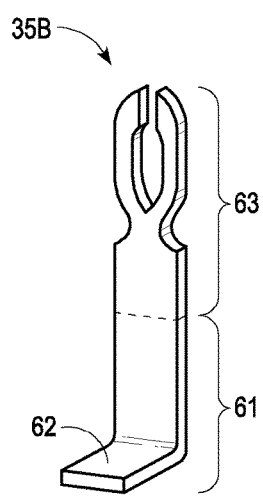
FIG. 5B is a diagram of a second example of an electrical press-fit terminal.

FIG. 5B is a diagram of a second example 35B of electrical press-fit terminal 35. The lower portion 61 of the terminal has a laterally extending landing pad portion 62. The upper press-fit pin portion 63 of this terminal is of the "fork" type.

Figure 5C:
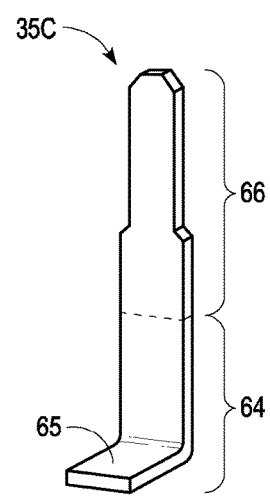
FIG. 5C is a diagram of a third example of an electrical press-fit terminal.

FIG. 5C is a diagram of a third example 35C of electrical press-fit terminal 35. The lower portion 64 of the terminal has a laterally extending landing pad portion 65. The upper press-fit pin portion 66 of this terminal is of the "post" type.

Figure 6:
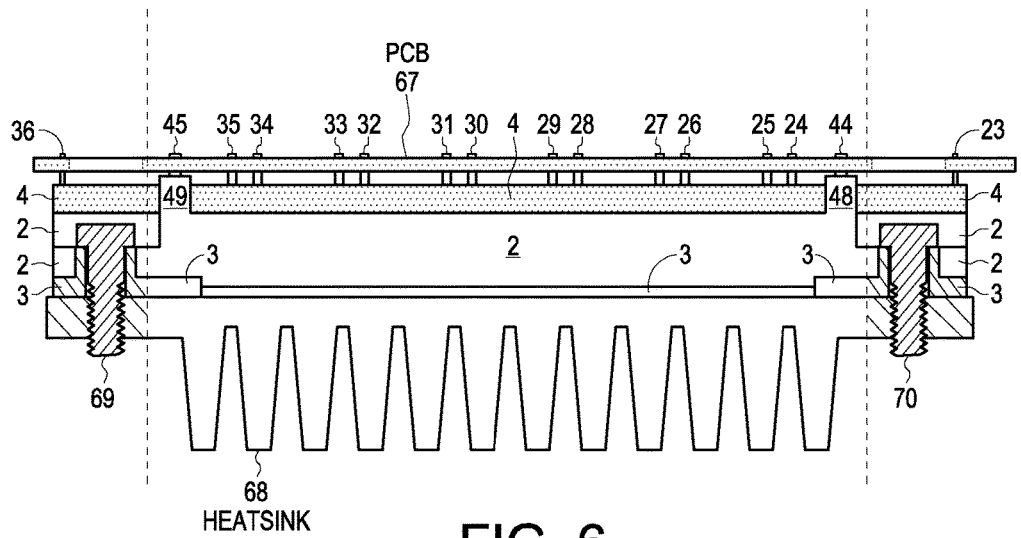
FIG. 6 is a side view of an assembly involving the power semiconductor device module of FIG. 1 press-fit to a PCB and bolted to a heatsink. The areas of the bolts 69 and 70 are shown in cross-section.

FIG. 6 is a cross-sectional side view of an assembly involving the power semiconductor device module 1 of FIG. 1. The diagram is illustrative and is not to scale. The areas of the bolts 69 and 70 are shown in cross-section whereas the center part of the diagram shows the assembly from the side. The top side of the power semiconductor device module 1 is press-fit attached to the bottom side of a PCB 67. Each of the press-fit pin portions of the electrical press-fit terminals and each of the press-fit pin portions of the mechanical corner press-fit anchors is forced into a corresponding plated-through hole in the PCB. A finned metal heatsink 68 is attached to the backside surface of the baseplate 3 and is held in place by four bolts, including the two bolts 69 and 70 pictured. There are four holes in the PCB, one for each of the four bolts. Each bolt is inserted downward through its corresponding hole in the PCB. Each bolt sticks through its corresponding hole in the module (one of unthreaded mounting holes 50-53), and then threads into a corresponding threaded hole in the heatsink 68. The inside of the mounting hole is actually a metal collar extension portion of the baseplate. As the bolt is tightened, the bottom of the head of the bolt contacts the top of the collar extension portion. As the bolt is rotated further, the heatsink is drawn up toward the bottom surface of the baseplate of the module. The bolts are torqued down to press the heatsink to the bottom of the baseplate of the module.

Figure 7:
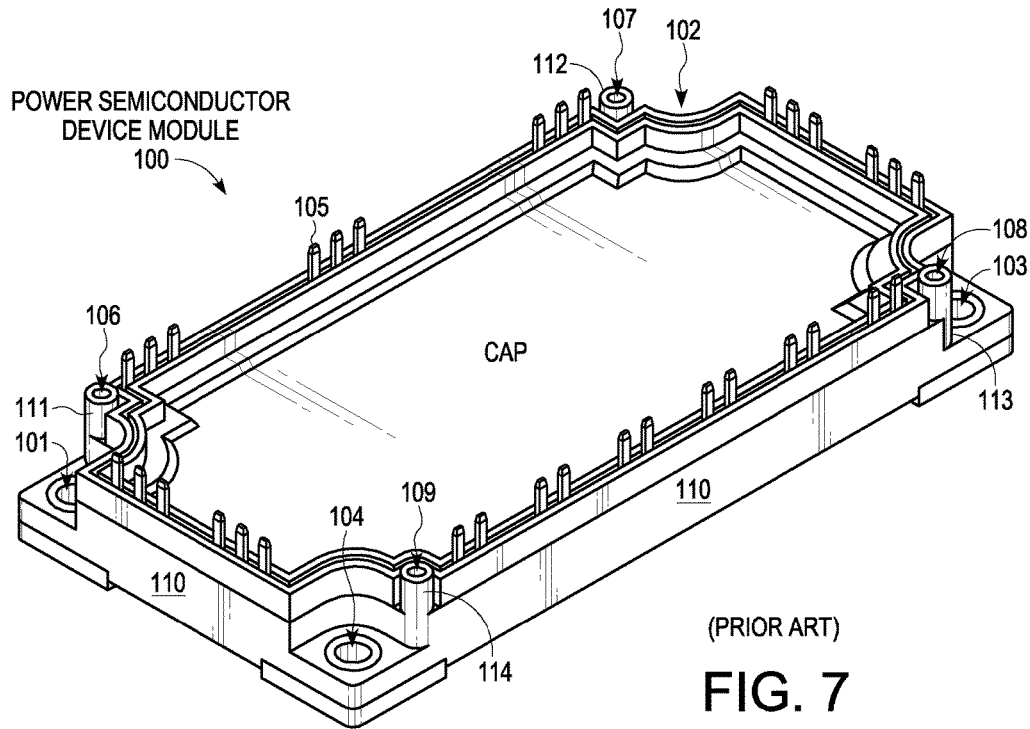
FIG. 7 (Prior Art) is a perspective diagram of one type of conventional power semiconductor device module.

Conventionally in the art, special press equipment is used to press the prior art module 100 of FIG. 7 into a PCB so that the press-fit pins of the module are forced into their respective plated through-holes of the PCB in the proper way. The press equipment measures force versus time. Based on the force and time measurements, the press equipment determines when to stop forcing the module into the PCB. The determination of when to stop is an indirect measure of cold weld quality. The determination of when to stop is not made based on how far the top surface of the module is from the PCB. Sometimes the press equipment stops the pressing operation when there are still separations between the tops of the cylinder stand-off extensions 111-114 (also sometimes called "domes" or "mounting stand-offs") of the housing frame 110 and the PCB. Other times the press equipment stops the pressing operation when there is no separation between the tops of the cylinder stand-off extensions 111-114 and the PCB. Sometimes a cylinder stand-off extension at one corner of the module is left contacting the PCB but another cylinder stand-off extension at another corner of the module is left with space between the top of that cylinder stand-off extension and the PCB. The final positions of the press-fit pins in their respective holes in the PCB can be different in the various corners of the same module, and can be different from module to module.

After the pressing equipment has been used to force the press-fit pins of the prior art module 100 into the PCB, the press-fit pins are left cold welded to the metal of their respective plated through-holes. Next, in what is usually a manual process, self-tapping screws or bolts are screwed down through holes in the PCB and into axial holes in the cylindrical stand-off extensions 111-114. The head of a screw on the top of the PCB forces down onto the PCB with respect to the module so that the screw head holds the PCB down onto the module. Such a screw has threads. As the screw is screwed into the hole, these threads in a self-tapping fashion cut into the soft polymer plastic material of the inside wall of the cylindrical stand-off extension. As a result, the screws once installed are not easily pulled out. This allows the screws to withstand a desired amount of pullout force. When the rotation of such a screw or bolt is stopped during installation is determined based on the turning torque reaching a detected maximum. It has been determined that due to the potential separation between the tops of the cylindrical stand-off extensions 111-114 of the housing frame 110 and the PCB, the application of these screws or bolts sometimes imparts an undesirable amount of mechanical stress on the PCB. Sometimes the application of a screw or bolt leaves the PCB pulled and warped downward toward the module in the locale of the screw or bolt head. This warpage, and the associated mechanical stress, can cause various types of failures. The novel mechanical corner press-fit anchors 42-45 described above in connection with FIGS. 1-3 overcome these problems by dispensing with the screws or bolts. The mechanical holding function of the prior art screws or bolts is fulfilled by the mechanical corner press-fit anchors 42-45. The press equipment inserts the press-fit pin portions of the mechanical corner press-fit anchors into corresponding plated through-holes in the PCB in the same way, and at the same time, that it inserts the press-fit pin portions of the electrical press-fit terminals into their corresponding plated through-holes. The mechanical corner anchors do not have heads. As a result, the PCB is not left in a warped condition with screw or bolt heads pulling down and warping the PCB downward toward the module. In addition, the expense and delay of the extra manual step of applying the screws or bolts, and using the torque driver, is avoided.

Although certain specific embodiments are described above for instructional purposes, the teachings of this patent document have general applicability and are not limited to the specific embodiments described above. The press-fit portion of the mechanical corner press-fit anchor can be of any suitable style of press-fit pin, including a forked style pin or a so-called eye-of-the-needle style pin, and need not be a post pin style press-fit pin. The lower portion of a mechanical press-fit anchor need not have any barb or catch, but rather can be of a smooth and regular cylindrical shape or a smooth and regular bar shape as long it is has enough frictional attachment to the plastic of the housing frame to provide the necessary anchor pull out resist force. Many other suitable ways of attaching the press-fit pin portion of an anchor to the housing frame are possible. A mechanical corner press-fit anchor may have a threaded lower portion so that the threaded lower portion can be screwed down into the hole in a cylindrical stand-off extension. In one example, the same terminal insertion equipment that automatically inserts the electrical press-fit terminals into corresponding channels in the housing also inserts the mechanical corner press-fit anchors. Accordingly, various modifications, adaptations, and combinations of various features of the described embodiments can be practiced without departing from the scope of the invention as set forth in the claims.

What is claimed is:

1. A power semiconductor device module comprising:
a metal baseplate;
a housing frame formed of an electrically insulative material, wherein the housing frame and the metal base plate fit together to form a shallow tray with an upper rim;
a cap formed of an electrically insulative material disposed on the upper rim, the cap having a plurality of peripheral holes formed therein;
a plurality of electrical press-fit terminals, wherein each electrical press-fit terminal extends through a corresponding one of the peripheral holes such that a press-fit pin portion of the electrical press-fit terminal extends upward and away from the cap in a direction perpendicular to a planar bottom surface of the metal baseplate; and
a plurality of mechanical corner press-fit anchors disposed outside the upper rim, wherein each of the mechanical corner press-fit anchors has a press-fit pin portion that extends upward and away from the housing frame in a direction perpendicular to the planar bottom surface of the metal baseplate.

2. The power semiconductor device module of claim 1, wherein no press-fit pin portion of any of the plurality of electrical press-fit terminals is press-fit connected to any printed circuit board, and wherein no press-fit pin portion of any of the four mechanical corner press-fit anchors is press-fit connected to any printed circuit board.

3. The power semiconductor device module of claim 2, wherein each press-fit pin portion of each of the electrical press-fit terminals has a shape taken from the group consisting of: a post shape, a fork shape, and an eye-of-the-needle shape, and wherein each press-fit pin portion of each of the mechanical corner press-fit anchors has a shape taken from the group consisting of: a post shape, a fork shape, and an eye-of-the-needle shape.

4. The power semiconductor device module of claim 2, wherein none of the mechanical corner press-fit anchors is electrically connected to any circuitry disposed in the power semiconductor device module.

5. The power semiconductor device module of claim 2, wherein each of the press-fit pin portions of each of the electrical press-fit terminals has a first cross-sectional area taken in a plane at a top surface of the power semiconductor device module, wherein each of the press-fit pin portions of each of the mechanical corner press-fit anchors has a second cross-sectional area taken in a plane at a top surface of the housing frame, wherein the second cross-sectional area is greater than the first cross-sectional area.

6. The power semiconductor device module of claim 2, wherein the cap has a substantially rectangular shape when the power semiconductor device module is considered from a top-down perspective, and wherein the plurality of peripheral holes forms a peripheral ring of holes that extends along four peripheral edges of the cap when the power semiconductor device module is considered from the top-down perspective.

7. The power semiconductor device module of claim 2, wherein the housing frame has four cylindrical extension portions, and wherein each respective one of the four mechanical corner press-fit anchors extends from a corresponding one of the four cylindrical extension portions.

8. A power semiconductor device module comprising:
a metal baseplate, wherein a bottom surface of the metal baseplate is disposed in a plane;
a housing frame formed of an electrically insulative material, wherein the housing frame engages the metal baseplate such that the metal baseplate and the housing frame together form a tray, wherein the tray has a rim;
a cap formed of an electrically insulative material disposed on the rim, thereby covering the tray;
a plurality of electrical press-fit terminals, wherein a press-fit pin portion of each electrical press-fit terminal extends upward and away from the cap in a direction perpendicular to the plane of the bottom surface of the metal baseplate;
a plurality of mechanical corner press-fit anchors, each having a lower portion that extends into the housing frame, wherein each of the mechanical corner press-fit anchors also has a press-fit pin portion that extends out of the housing frame in a direction perpendicular to the plane of the planar bottom surface of the metal baseplate; and
power electronics disposed in the tray, wherein the power electronics are electrically coupled to each of the electrical press-fit terminals, wherein the power electronics include at least one component taken from the group consisting of: a power diode, a power field effect transistor, a power insulated gate bipolar transistor, and a power thyristor.

9. The power semiconductor device module of claim 8, wherein each of the mechanical corner press-fit anchors is secured to the housing frame.

10. The power semiconductor device module of claim 8, wherein each of the lower portions of the mechanical corner press-fit anchors engages the housing frame in a manner that prevents the mechanical corner press-fit anchors from being pulled out of the housing frame under an anchor pull out resist force, wherein the anchor pull out resist force is a force greater than a minimum pull out extraction force at which one of the electrical press-fit terminals can be disengaged from a printed circuit board were the electrical press-fit terminal to have been press-fit mounted to the printed circuit board.

11. The power semiconductor device module of claim 8, wherein each of the lower portions of the mechanical corner press-fit anchors engages the housing frame such that under an anchor pull out resist force the mechanical corner press-fit anchors do not move away from the housing frame in a direction perpendicular to the plane of the bottom surface of the metal baseplate.

12. The power semiconductor device module of claim 8, wherein each of the press-fit pin portions of the electrical press-fit terminals has a first cross-sectional area taken in a plane at a top surface of cap, wherein each of the press-fit pin portions of the mechanical corner press-fit anchors has a second cross-sectional area taken in a plane at a top surface of the housing frame, wherein the second cross-sectional area is greater than the first cross-sectional area.

13. An assembly comprising:
a power semiconductor device module comprising:
a metal baseplate, wherein a bottom surface of the metal baseplate is disposed in a plane;
a housing frame formed of an electrically insulative material, wherein the housing frame engages the metal baseplate, wherein the housing frame at least in part forms a tray;
a cap formed of an electrically insulative material that covers the tray;
a plurality of electrical press-fit terminals, wherein each electrical press-fit terminal has a press-fit pin portion that extends away from the cap in a direction perpendicular to the plane of the bottom surface of the metal baseplate; and
a plurality of mechanical corner press-fit anchors, wherein each of the mechanical corner press-fit anchors has a lower portion that extends into the housing frame, and wherein each of the mechanical corner press-fit anchors also has a press-fit pin portion that extends away from the housing frame in a direction perpendicular to the plane of the planar bottom surface of the metal baseplate; and
a printed circuit board, wherein the press-fit pin portions of the electrical press-fit terminals and the press-fit pin portions of the mechanical corner press-fit anchors are press-fit connected to the printed circuit board.

14. The assembly of claim 13, further comprising:
a heatsink that is mounted to the power semiconductor device module so that the heatsink is in thermal contact with the bottom surface of the metal baseplate.

15. The assembly of claim 13, wherein each of the press-fit pin portions of each of the electrical press-fit terminals has a first cross-sectional area taken in a plane at a top surface of cap, wherein each of the press-fit pin portions of each of the mechanical corner press-fit anchors has a second cross-sectional area taken in a plane at a top surface of the housing frame, wherein the second cross-sectional area is greater than the first cross-sectional area.

16. The assembly of claim 13, wherein all of the mechanical corner press-fit anchors are disposed outside the cap when the power semiconductor device module is considered from a top-down perspective looking down onto the cap.

17. The assembly of claim 13, wherein the lower portion of each of the mechanical corner press-fit anchors engages the housing frame such that under an anchor pull out resist force it does not move away from the housing frame in a direction perpendicular to the plane of the bottom surface of the metal baseplate, wherein the anchor pull out resist force is a force greater than a minimum pull out extraction force at which one of the electrical press-fit terminals can be disengaged from a printed circuit board were the electrical press-fit terminal to have been press-fit mounted to the printed circuit board.

18. The assembly of claim 13, wherein the power semiconductor device module further comprises power electronics disposed in the tray, wherein the power electronics are electrically coupled to each of the electrical press-fit terminals, wherein the power electronics include at least one component taken from the group consisting of: a power diode, a power field effect transistor, a power insulated gate bipolar transistor, and a power thyristor.

19. The assembly of claim 13, wherein the housing frame has extension portions, and wherein each of the mechanical corner press-fit anchors extends from a corresponding one of the extension portions.

20. A power semiconductor device module, wherein the power semiconductor device module has a bottom surface and has a rectangular shape when considered from a top-down perspective, the power semiconductor device module comprising:
- a metal baseplate, wherein a planar bottom surface of the metal baseplate is the bottom surface of the power semiconductor device module;
- a housing frame of an insulative plastic material, wherein the housing frame is disposed with respect to the metal baseplate such that the metal baseplate and the housing frame together form a shallow tray;
- power electronics disposed in the shallow tray, wherein the power electronics includes at least one component taken from the group consisting of: a power diode, a power field effect transistor, a power insulated gate bipolar transistor, and a power thyristor;
- a cap of an insulative plastic material that fits down onto the housing frame thereby enclosing the power electronics in the shallow tray;
- a plurality of electrical press-fit terminals, wherein each electrical press-fit terminal extends upward in a direction normal to the planar bottom surface of the metal baseplate, wherein each of the electrical press-fit terminals has a first cross-sectional area; and
- a plurality of mechanical press-fit anchors, wherein each of the mechanical press-fit anchors extends upward in a direction normal to the planar bottom surface of the metal baseplate, wherein none of the mechanical press-fit anchors is electrically coupled to any other one of the mechanical press-fit anchors, wherein none of the mechanical press-fit anchors is electrically coupled to any of the electrical press-fit terminals, wherein each of the mechanical press-fit anchors has a second cross-sectional area, and wherein the second cross-sectional area is larger than the first cross-sectional area.

* * * * *